(12) United States Patent
Ohta et al.

(10) Patent No.: US 11,189,551 B2
(45) Date of Patent: Nov. 30, 2021

(54) SEMICONDUCTOR DEVICE

(71) Applicant: TDK CORPORATION, Tokyo (JP)

(72) Inventors: Naoki Ohta, Tokyo (JP); Keita Miyachi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/184,424

(22) Filed: Nov. 8, 2018

(65) Prior Publication Data
US 2019/0157189 A1   May 23, 2019

(30) Foreign Application Priority Data

Nov. 22, 2017 (JP) .............................. JP2017-224288

(51) Int. Cl.
*H01L 23/495* (2006.01)
*H01L 23/31* (2006.01)

(52) U.S. Cl.
CPC .... *H01L 23/49541* (2013.01); *H01L 23/3107* (2013.01); *H01L 23/49524* (2013.01); *H01L 23/49589* (2013.01); *H01L 2224/05554* (2013.01); *H01L 2224/48091* (2013.01); *H01L 2224/48247* (2013.01); *H01L 2924/1815* (2013.01); *H01L 2924/19105* (2013.01)

(58) Field of Classification Search
CPC ............. H01L 23/4951; H01L 23/3107; H01L 23/49589; H01L 23/49524; H01L 23/49555; H01L 23/49593; H01L 23/49838; H01L 23/31; H01L 23/495–49541

See application file for complete search history.

(56) References Cited

U.S. PATENT DOCUMENTS

| | | | | |
|---|---|---|---|---|
| 4,725,692 A | * | 2/1988 | Ishii | .................. H01L 23/49541 174/531 |
| 5,521,429 A | * | 5/1996 | Aono | ................ H01L 23/49548 257/666 |

(Continued)

FOREIGN PATENT DOCUMENTS

| JP | S49-22855 Y | 6/1974 |
|---|---|---|
| JP | 2000-124380 A | 4/2000 |

(Continued)

OTHER PUBLICATIONS

JP 2017-224288—Notice_of_Reasons_for_Refusal (Year: 2019).*
JP 2017-224288—Written Opinion (Year: 2019).*

*Primary Examiner* — Vincent Wall
(74) *Attorney, Agent, or Firm* — Oliff PLC

(57) ABSTRACT

A semiconductor device according to an embodiment of the disclosure includes a base, a semiconductor element, a first conductor, and a second conductor. The base has an outer edge including a first part, a second part, and a third part. The first part and the second part are substantially parallel to each other. The third part extends in a direction that intersects both of the first part and the second part. The semiconductor element is covered with the base. The first conductor is coupled to the semiconductor element, and protrudes to an outside of the base from the first part of the outer edge. The second conductor is coupled to the semiconductor element, and protrudes to the outside of the base from the third part of the outer edge.

7 Claims, 10 Drawing Sheets

(56) References Cited

U.S. PATENT DOCUMENTS

| | | | |
|---|---|---|---|
| 8,232,629 B2* | 7/2012 | Koike | H01L 21/565 |
| | | | 257/676 |
| 9,704,979 B2* | 7/2017 | Muto | H01L 23/49551 |
| 9,905,497 B2 | 2/2018 | Susaki et al. | |
| 2005/0040512 A1* | 2/2005 | Tsubonoya | H01L 23/49541 |
| | | | 257/692 |
| 2010/0232131 A1* | 9/2010 | Qian | H05K 7/1432 |
| | | | 361/813 |
| 2013/0181304 A1* | 7/2013 | Milano | H01L 43/065 |
| | | | 257/421 |
| 2018/0138110 A1* | 5/2018 | Cook | B22F 3/1021 |

FOREIGN PATENT DOCUMENTS

| | | | |
|---|---|---|---|
| JP | 2000124380 A | * | 4/2000 |
| JP | 2009-129952 A | | 6/2009 |
| JP | 2010-80914 A | | 4/2010 |

* cited by examiner

SEMICONDUCTOR DEVICE

CROSS REFERENCE TO RELATED APPLICATIONS

This application claims the benefit of Japanese Priority Patent Application No. 2017-224288 filed on Nov. 22, 2017, the entire contents of which are incorporated herein by reference.

BACKGROUND

The disclosure relates to a semiconductor device that includes a semiconductor element covered with a base.

There has been known a semiconductor device that includes a semiconductor element provided on a substrate. Upon manufacturing such a semiconductor device, a lead frame attached with the semiconductor element has been used. For example, reference is made to Japanese Examined Utility Model Application Publication No. S49-22855.

SUMMARY

A semiconductor device according to an embodiment of the disclosure includes a base, a semiconductor element, a first conductor, and a second conductor. The base has an outer edge including a first part, a second part, and a third part. The first part and the second part are substantially parallel to each other. The third part extends in a direction that intersects both of the first part and the second part. The semiconductor element is covered with the base. The first conductor is coupled to the semiconductor element, and protrudes to an outside of the base from the first part of the outer edge. The second conductor is coupled to the semiconductor element, and protrudes to the outside of the base from the third part of the outer edge.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1A:
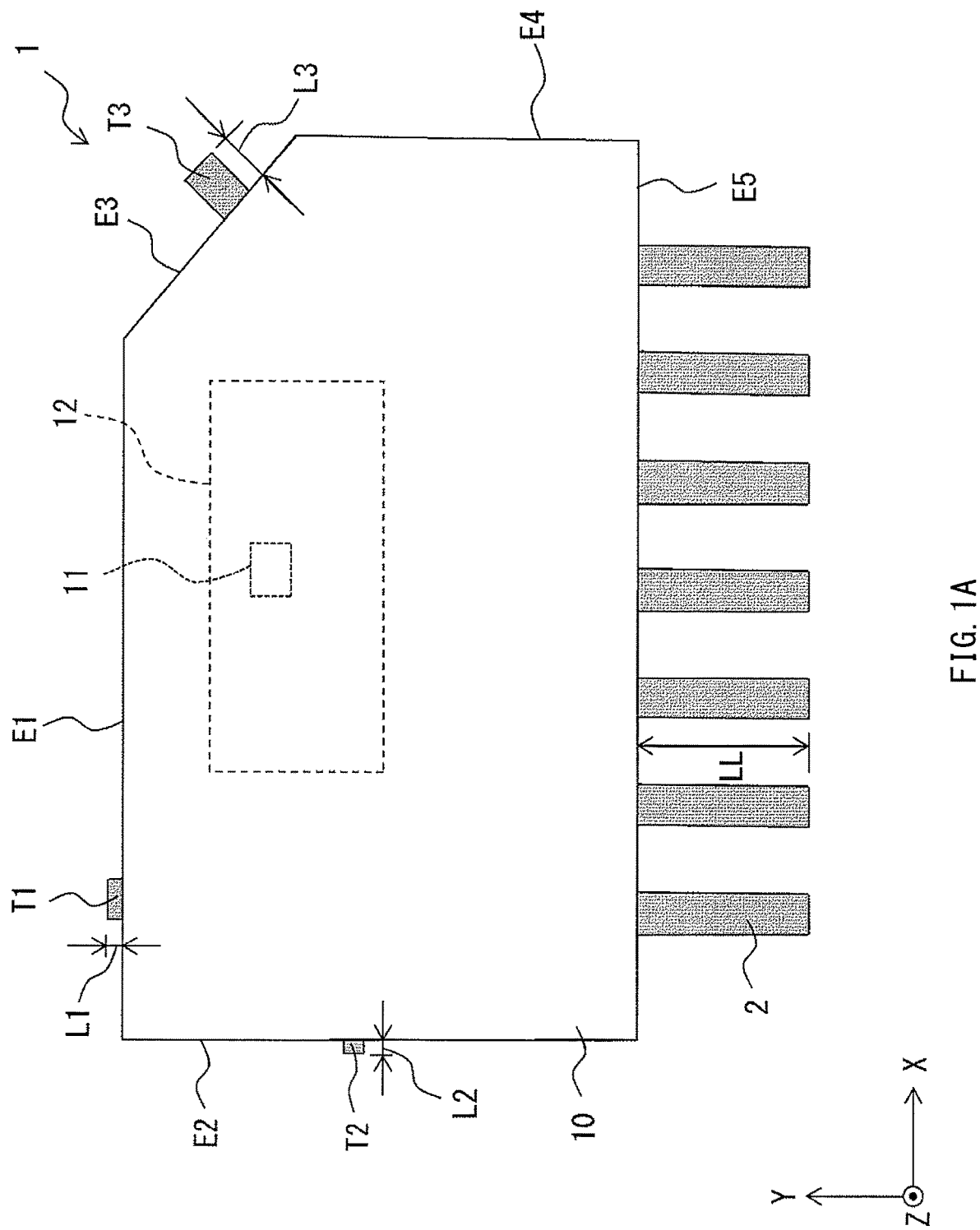
FIG. 1A is a plan view of an outline configuration example of an appearance of a semiconductor device according to one embodiment of the disclosure.

Some embodiments of the disclosure are described below in detail with reference to the accompanying drawings.

In a case of using a lead frame that supports a semiconductor element as described above, the lead frame is eventually removed from a semiconductor device. However, an electrically conductive linear part having been used to support the semiconductor element partially remains in the semiconductor device, leading to a state in which an end of the electrically conductive linear part protrudes from a molded insulator. Such an electrically conductive linear part is typically referred to as a tie bar, for example. The tie bar is often in electrical conduction with the semiconductor element, thus causing a possible adverse influence on the semiconductor element, for example, in a case where another electrical conductor comes into contact with the tie bar unintentionally.

It is desirable to provide a semiconductor device having superior handleability as well as higher operational reliability.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. Example Embodiment (An example of a semiconductor device in which three tie bars protrude from a mold resin with a semiconductor element embedded therein)
   1.1 Overall Configuration of Semiconductor Device
   1.2 Manufacturing Method of Semiconductor Device
   1.3 Workings and Example Effects of Semiconductor Device
2. Modification Examples (First to Third Modification Examples)
   2.1 First Modification Example (An example of a semiconductor device in which four tie bars protrude from a mold resin with a semiconductor element embedded therein)
   2.2 Second Modification Example (An example of a semiconductor device in which three tie bars protrude from a curved outer edge part of a semicircular mold resin with a semiconductor element embedded therein)
   2.3 Third Modification Example (An example of a semiconductor device in which a plurality of tie bars protrude from a curved outer edge part and a straight outer edge part of a mold resin with a semiconductor element embedded therein)

1. EXAMPLE EMBODIMENT

1.1 Overall Configuration of Semiconductor Device 1

Figure 1B:
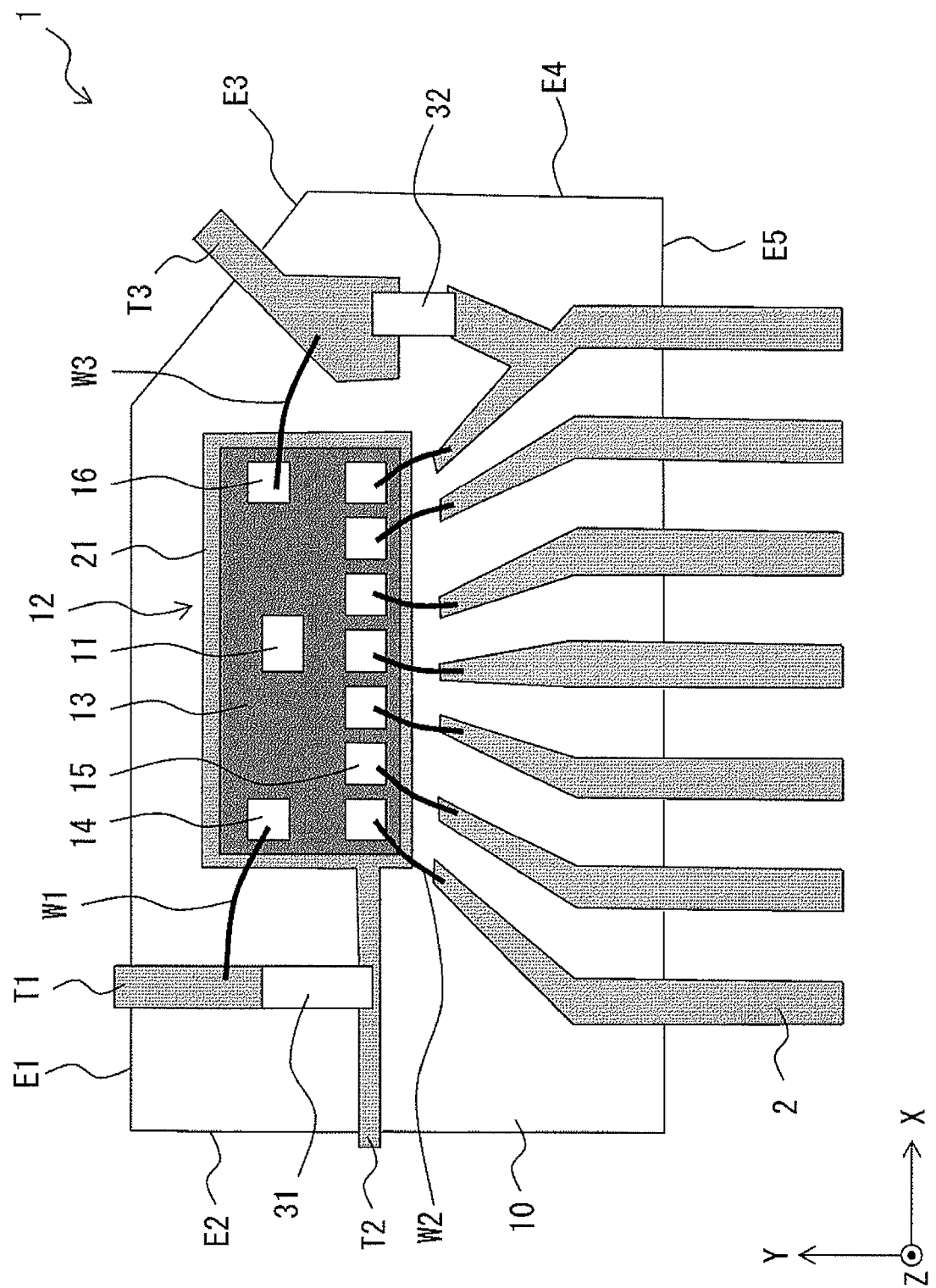
FIG. 1B is a plan view of an outline configuration example of an inside of the semiconductor device illustrated in FIG. 1A.

FIG. 1A is a schematic plan view of an outline configuration example of an appearance of a semiconductor device 1 including a semiconductor element 11 according to an example embodiment of the disclosure. FIG. 1B is a schematic plan view of an outline configuration example of an inside of the semiconductor device 1.

Referring to FIGS. 1A and 1B, the semiconductor device 1 may include a mold resin 10, tie bars T1 to T3, and a plurality of leads 2. A semiconductor chip 12 including a semiconductor element 11 may be embedded in the mold resin 10. The tie bars T1 to T3 and the plurality of leads 2 may protrude from an outer edge of the mold resin 10.

The mold resin 10 may be made of an epoxy resin, for example, and may be a pentagon defined by the outer edge configured by outer edge parts E1 to E5, in an X-Y plane. In this example, the outer edge part E1 and the outer edge part E5 are substantially parallel to each other, and may each extend in an X-axis direction. Further, the outer edge part E2 and the outer edge part E4 may be substantially parallel to each other, and may each extend in a Y-axis direction. In other words, the outer edge part E1 and the outer edge part E5 may be each substantially orthogonal to each of the outer edge part E2 and the outer edge part E4. In addition, an outer edge part E3 may extend in a direction that intersects not only the outer edge part E1 and the outer edge part E5 but also the outer edge part E2 and the outer edge part E4. In other words, the outer edge part E3 may extend in a direction inclined to both of the X-axis direction and the Y-axis direction.

The tie bars T1 to T3 may protrude to the outside of the mold resin 10, respectively, from the outer edge parts E1 to E3 of the mold resin 10. The plurality of leads 2 may each protrude in a negative (−) Y-direction from the outer edge part E5 of the mold resin 10. The plurality of leads 2 may be arranged side by side along the outer edge part E5. In other words, the plurality of leads 2 may be arranged adjacent to one another in the X-axis direction. The plurality of leads 2 may each serve as a wiring line that couples the semiconductor chip 12 and an external device together.

The semiconductor chip 12 may include the semiconductor element 11, for example, on a substrate 13 that is placed on a support 21 connected to the tie bar T2. A first pad 14, a plurality of second pads 15, and a third pad 16 may be provided, in addition to the semiconductor element 11, on the substrate 13. The first pad 14, the second pads 15, and the third pad 16 may be each coupled to the semiconductor element 11. The first pad 14 may be coupled to the tie bar T1 via a wire W1. The second pads 15 may be coupled to the respective leads 2 via corresponding ones of a plurality of wires W2. Further, the third pad 16 may be coupled to the tie bar T3 via a wire W3. Accordingly, the tie bar T1, the leads 2, and the tie bar T3 may be coupled to the semiconductor element 11 via the wires W1 to W3, respectively, as well as via the first pad 14, the second pads 15, and the third pad 16, respectively.

It is to be noted that the mold resin 10 in the present example embodiment is a specific but non-limiting example of a "substrate" in one embodiment of the disclosure. The outer edge parts E1, E5, E2, and E3 in the present example embodiment are specific but non-limiting examples, respectively, of a "first part", a "second part", a "third part", and a "fourth part" in one embodiment of the disclosure. The semiconductor element 11 in the present example embodiment is a specific but non-limiting example of a "semiconductor element" in one embodiment of the disclosure. The tie bars T1 to T3 in the present example embodiment are specific but non-limiting examples, respectively, of "first to third conductors" in one embodiment of the disclosure.

The semiconductor device 1 may include a first electronic component 31 between the tie bar T1 and the tie bar T2. The semiconductor device 1 may include a second electronic component 32 between the tie bar T3 and one of the leads 2. The first electronic component 31 and the second electronic component 32 may be each, for example, a capacitor or a resistor.

In the semiconductor device 1, a protrusion length L1 of the tie bar T1 from the outer edge part E1, a protrusion length L2 of the tie bar T2 from the outer edge part E2, and a protrusion length L3 of the tie bar T3 from the outer edge part E3 may be each sufficiently smaller than a protrusion length LL of the lead 2 from the outer edge part E5, as illustrated in FIG. 1A.

1.2 Manufacturing Method of Semiconductor Device 1

Description is given next of an example of a manufacturing method of the semiconductor device 1, with reference to FIGS. 2A to 2E. FIGS. 2A to 2E are each a schematic plan view of a process in the manufacturing method of the semiconductor device 1.

Figure 2A:
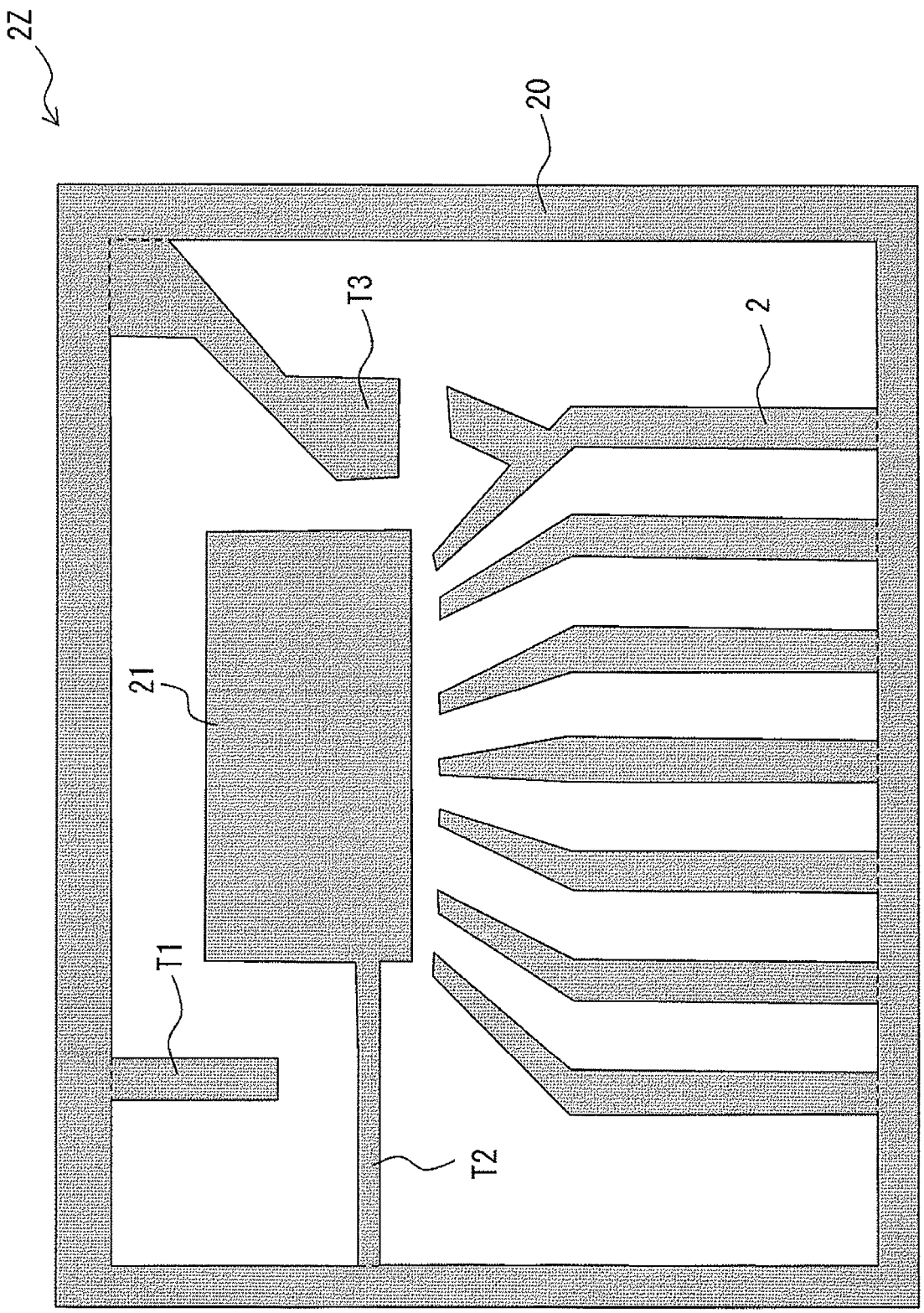
FIG. 2A is a plan view of a process in a manufacturing method of the semiconductor device illustrated in FIG. 1A.

First, as illustrated in FIG. 2A, a lead frame 2Z may be prepared. The lead frame 2Z may be a conductor in which respective parts that eventually serve as the support 21, the tie bars T1 to T3, and the plurality of leads 2 are coupled to and integrated with a frame part 20.

Figure 2B:
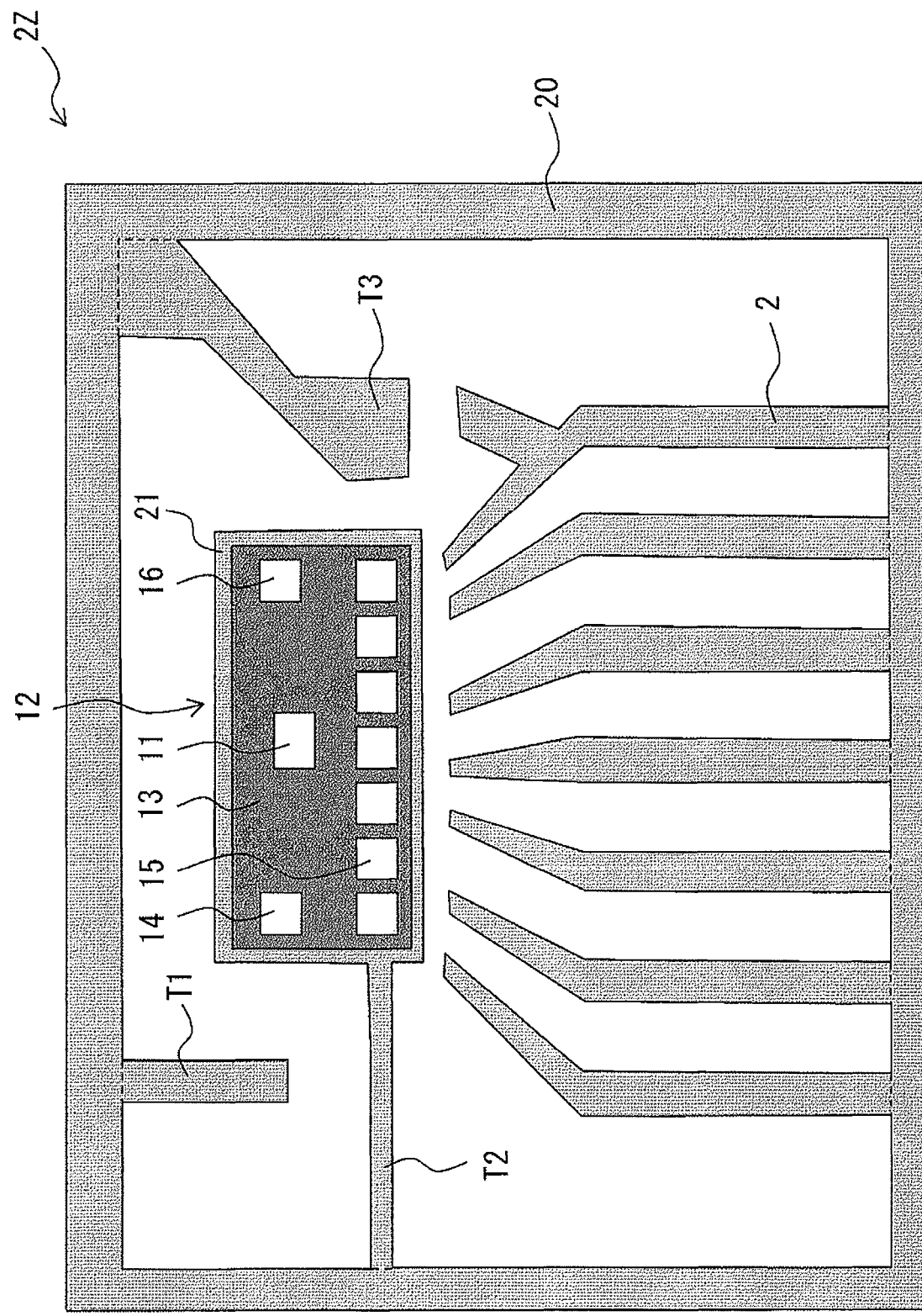
FIG. 2B is a plan view of a process subsequent to the process illustrated in FIG. 2A.
Figure 2C:
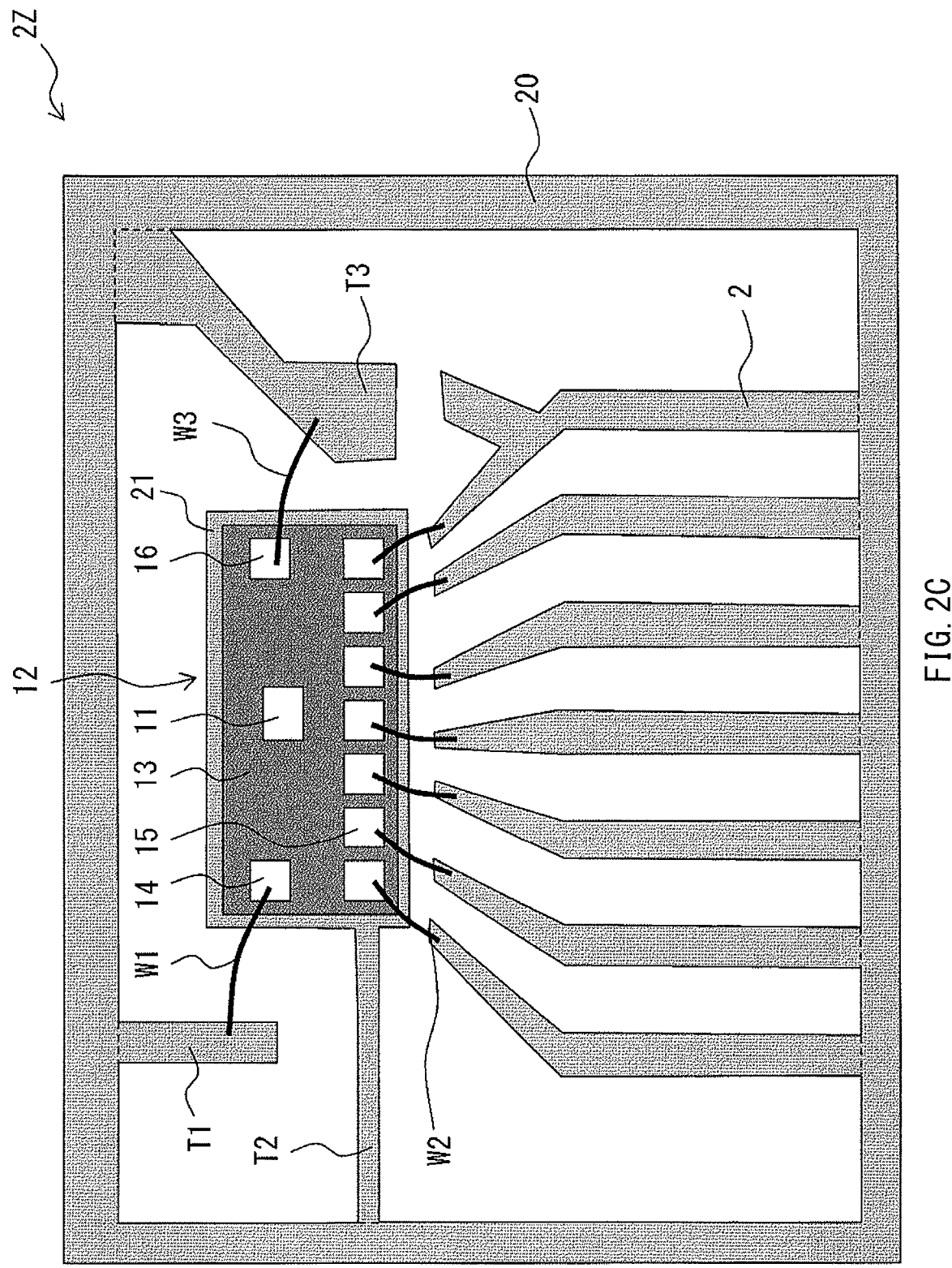
FIG. 2C is a plan view of a process subsequent to the process illustrated in FIG. 2B.

Next, as illustrated in FIG. 2B, the semiconductor chip 12 may be placed on the part that serves as the support 21 in the lead frame 2Z. Thereafter, as illustrated in FIG. 2C, wire bonding may be used to form the wire W1, the wires W2, and the wire W3. The wire W1 may couple the tie bar T1 and the first pad 14 together. The wires W2 may couple the respective leads 2 and the respective second pads 15 together. The wire W3 may couple the tie bar T3 and the third pad 16 together.

Figure 2D:
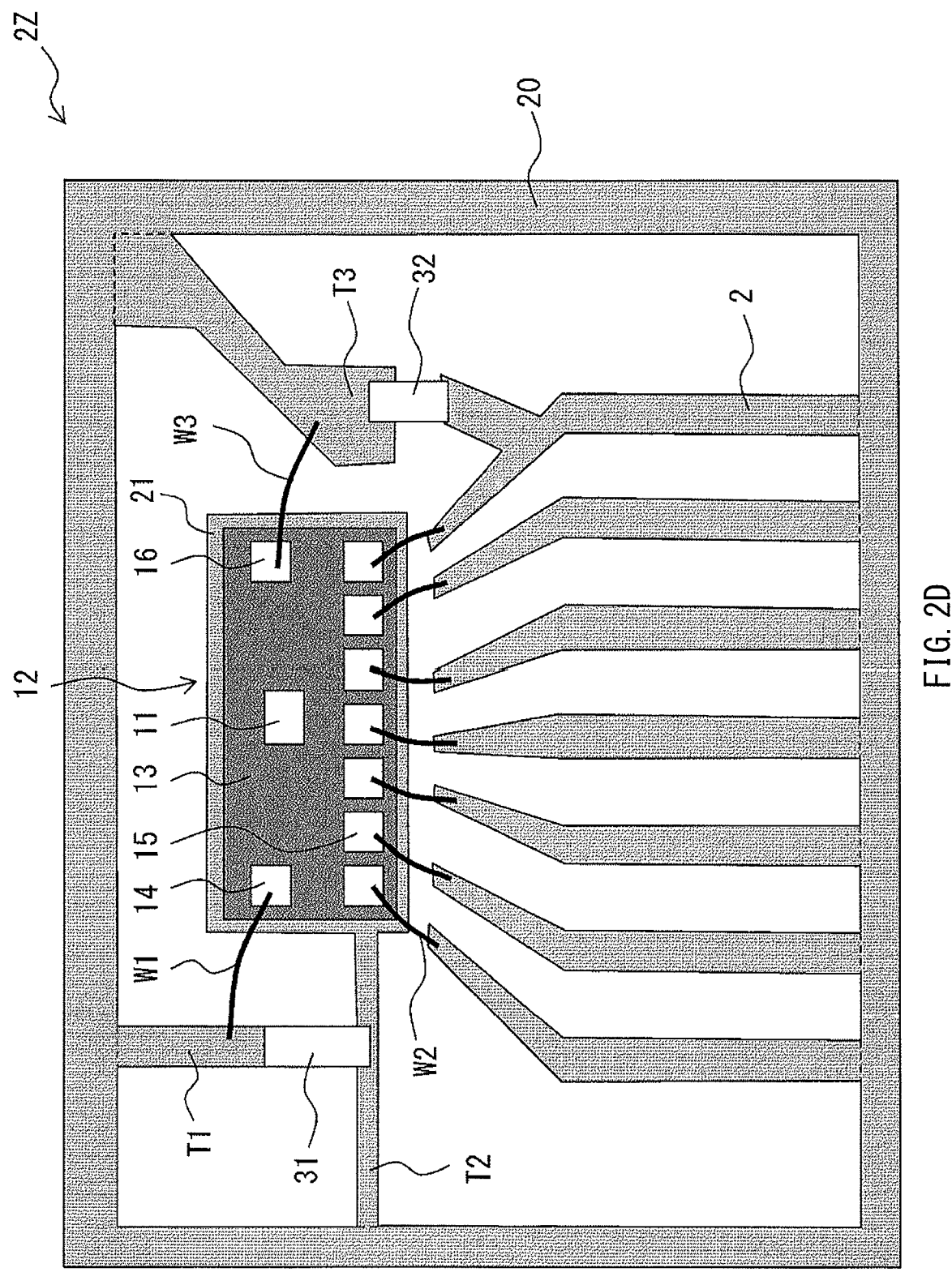
FIG. 2D is a plan view of a process subsequent to the process illustrated in FIG. 2C.

Next, as illustrated in FIG. 2D, the first electronic component 31 may be placed to straddle the tie bar T1 and the tie bar T2, and the second electronic component 32 may be placed to straddle one of the leads 2 and the tie bar T3.

Figure 2E:
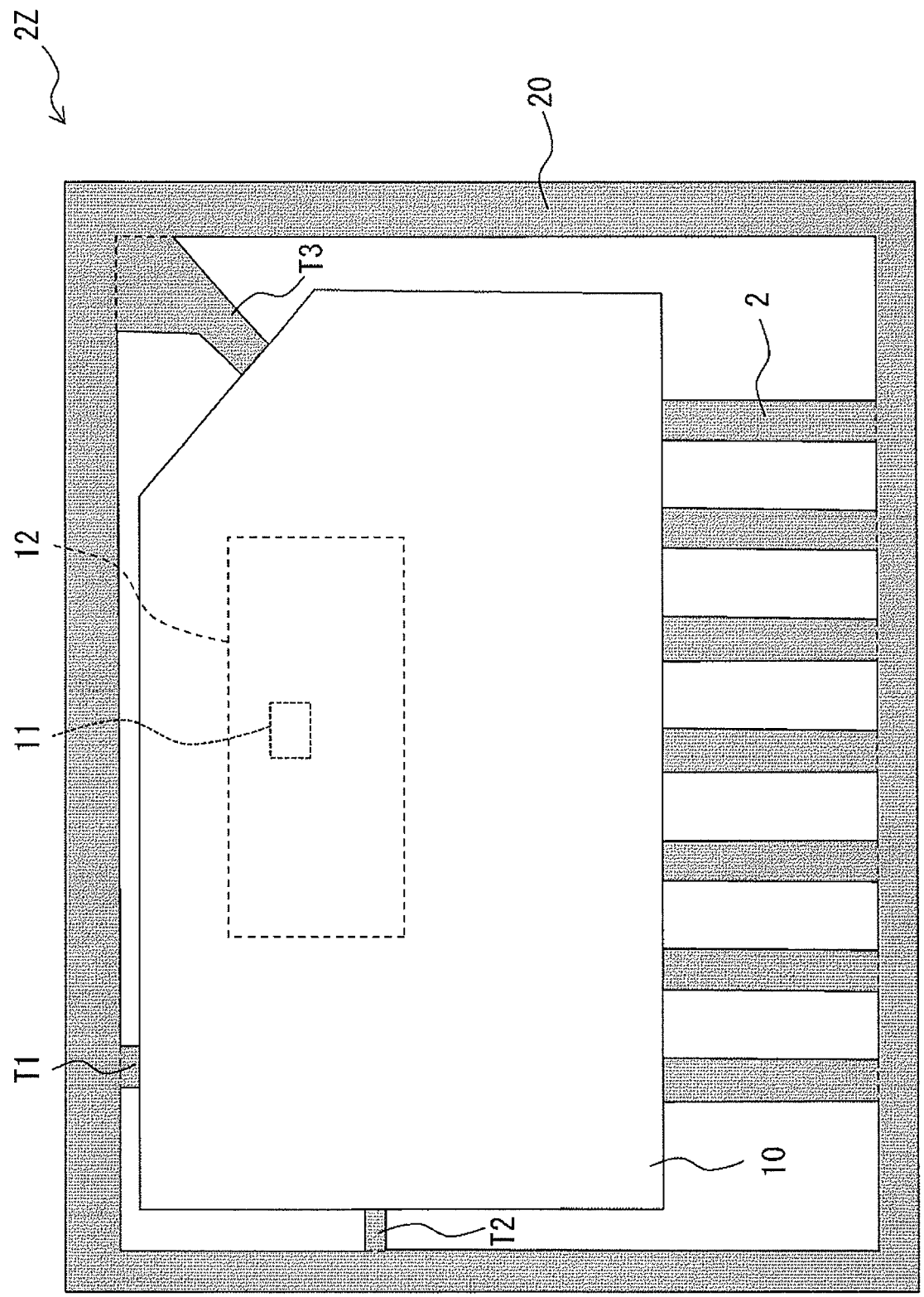
FIG. 2E is a plan view of a process subsequent to the process illustrated in FIG. 2D.

Next, the part, of the lead frame 2Z, where the semiconductor chip 12 is provided may be sandwiched by an unillustrated pair of dies. Thereafter, a space sandwiched by the pair of dies may be filled with a material such as an epoxy resin for solidification, thereby forming the mold resin 10 with the semiconductor chip 12 embedded therein, as illustrated in FIG. 2E.

Lastly, the frame part 20 of the lead frame 2Z may be cut out using a cutter, for example, thereby obtaining the semiconductor device 1 illustrated in FIGS. 1A and 1B.

1.3 Workings and Example Effects of Semiconductor Device 1

As described, in the semiconductor device 1 according to the present example embodiment, the tie bar T1 protrudes to the outside of the mold resin 10 from the outer edge part E1, and the tie bar T2 protrudes to the outside of the mold resin 10 from the outer edge part E2. In this example, the outer edge part E1 and the outer edge part E2 extend in directions that intersect each other, i.e., in orthogonal directions in FIGS. 1A and 1B. In other words, the outer edge part E1 and the outer edge part E2 extend to be nonparallel to each other. Accordingly, there is an extremely low possibility that an electrically conductive instrument such as tweezers comes into contact with both of the tie bar T1 and the tie bar T2 simultaneously when holding the mold resin 10 of the semiconductor device 1 using the electrically conductive instrument. Thus, it is possible to avoid an unexpected circumstance, for example, where the semiconductor element 11 may be damaged due to a short circuit between the tie bar T1 and the tie bar T2 via the electrically conductive instrument such as the tweezers. Hence, it is possible for the semiconductor device 1 to secure superior handleability as well as higher operational reliability.

In particular, the semiconductor device 1 of the present example embodiment may include the tie bar T3 coupled to the semiconductor element 11. The tie bar T3 may protrude to the outside of the mold resin 10 from the outer edge part E3 of the mold resin 10. The outer edge part E3 may extend in an oblique direction that intersects both of the outer edge part E1 and the outer edge part E2. Accordingly, there is an extremely low possibility that the electrically conductive instrument such as the tweezers comes into contact with both of the tie bar T1 and the tie bar T3 simultaneously, and that the electrically conductive instrument comes into contact with both of the tie bar T2 and the tie bar T3 simultaneously, when holding the mold resin 10 of the semiconductor device 1 using the electrically conductive instrument. Thus, it is possible to avoid an unexpected circumstance, for example, where the semiconductor element 11 may be damaged due to a short circuit between the tie bar T1 and the tie bar T3 or a short circuit between the tie bar T2 and the tie bar T3.

Moreover, in the semiconductor device 1 according to the present example embodiment, the protrusion length L1 of the tie bar T1 from the outer edge part E1, the protrusion length L2 of the tie bar T2 from the outer edge part E2, and the protrusion length L3 of the tie bar T3 from the outer edge part E3 may be each sufficiently smaller than the protrusion length LL of the lead 2 from the outer edge part E5. Hence, it becomes possible to sufficiently reduce probability of occurrence of an unexpected short circuit among the tie bars T1 to T3 via the electrically conductive instrument such as the tweezers when holding the mold resin 10 of the semiconductor device 1 using the electrically conductive instrument.

2. MODIFICATION EXAMPLES

The disclosure has been described hereinabove referring to the example embodiments. However, the disclosure is not limited to such example embodiments, and may be modified in a variety of ways.

For example, the description has been given referring to specific configuration examples (such as shape, arrangement, and number) of the respective components of the semiconductor device 1. However, the configuration examples of the respective components are not limited to those described in the foregoing example embodiment; any other shape, any other arrangement, and any other number, for example, may be adopted. For example, the shape of the base in the semiconductor device of an example embodiment of the disclosure is not limited to that of the mold resin 10 illustrated in FIGS. 1A and 1B. The shape and the arrangement of the electronic component in the semiconductor device of an example embodiment of the disclosure are not limited to those of each of the first electronic component 31 and the second electronic component 32 illustrated in figures such as FIG. 1B; any other shape and any other arrangement may be adopted. The semiconductor device according to any embodiment of the disclosure may include yet another electric component. The shape and the arrangement of each of the first to third conductors of an example embodiment of the disclosure are not limited to those illustrated in figures such as FIGS. 1A and 1B; any other shape and any other arrangement may be adopted. The number of the conductors in the semiconductor device of an example embodiment of the disclosure is not limited to three; the number of the conductors may be two or four or more. In the following, description is given of semiconductor devices according to some modification examples of the disclosure.

2.1 First Modification Example

Figure 3:
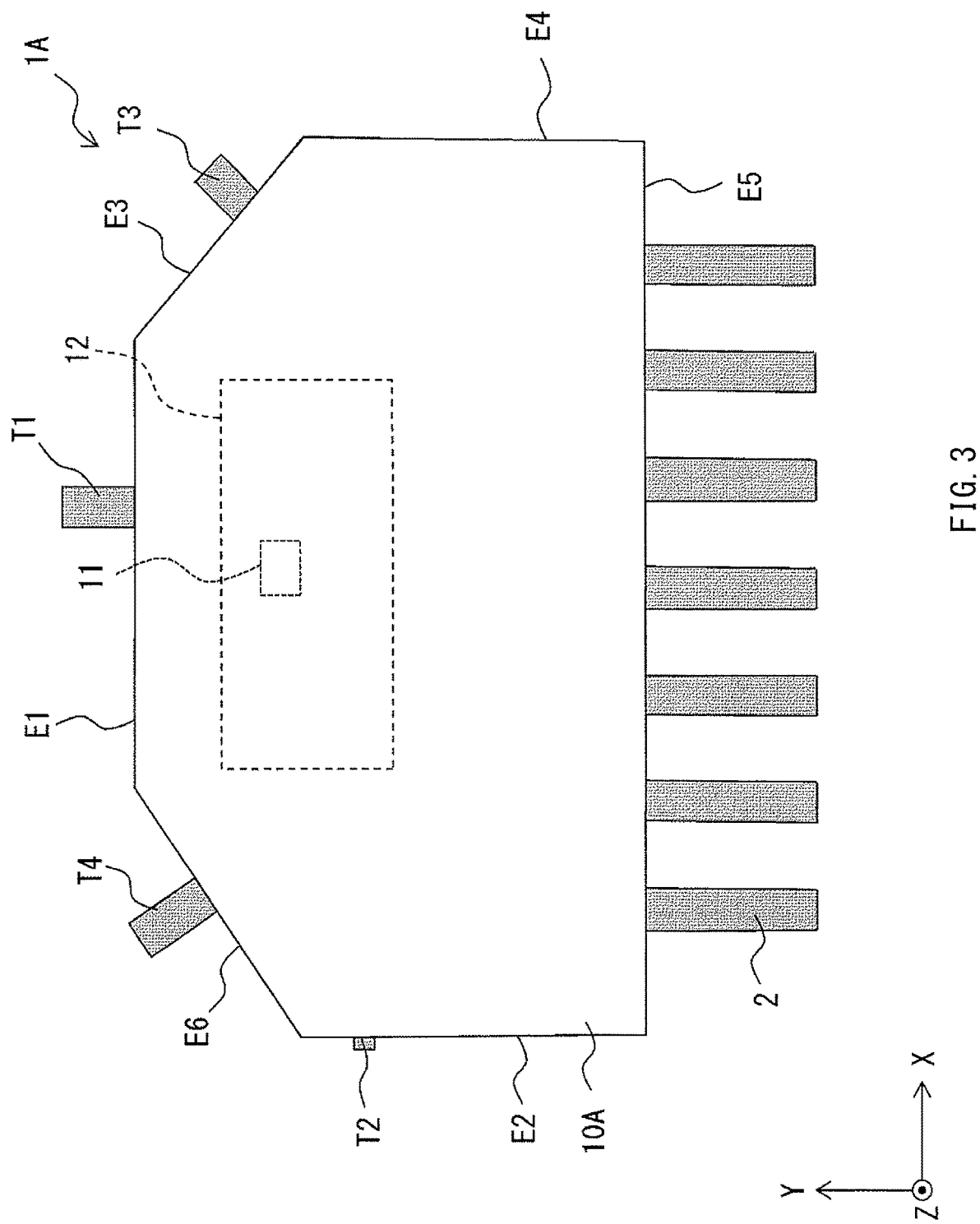
FIG. 3 is a plan view of an outline configuration example of an appearance of a semiconductor device according to a first modification example.

FIG. 3 is a plan view of an outline configuration example of an appearance of a semiconductor device 1A according to a first modification example of the disclosure. The semiconductor device 1A has substantially the same configuration as that of the semiconductor device 1 of the foregoing example embodiment, except that the semiconductor device 1A includes a mold resin 10A instead of the mold resin 10 and may further include a tie bar T4. The mold resin 10A differs from the mold resin 10 in that the mold resin 10A may further include an outer edge part E6 in addition to the outer edge parts E1 to E5. The tie bar T4 may protrude to the outside of the mold resin 10A from the outer edge part E6. In the semiconductor device 1A, the mold resin 10A may have a hexagonal planar shape. The outer edge part E6 interposed between the outer edge part E1 and the outer edge part E2 may extend in a direction that intersects any of the outer edge part E1, the outer edge part E2, and the outer edge part E3.

As described, in the semiconductor device 1A according to the present modification example, the tie bars T1 to T4 may protrude to the outside of the mold resin 10A from the outer edge parts E1 to E3 and E6, respectively. In this example, the outer edge parts E1 to E3 and E6 may extend in directions that intersect one another. In other words, the outer edge parts E1 to E3 and E6 may extend to be nonparallel to one another. Accordingly, there is an extremely low possibility that the electrically conductive instrument such as the tweezers comes into contact with two or more of the tie bars T1 to T4 simultaneously when holding the mold resin 10A of the semiconductor device 1A using the electrically conductive instrument. Thus, it is possible to avoid an unexpected circumstance, for example, where the semiconductor element 11 may be damaged due to a short circuit among two or more of the tie bars T1 to T4 via the electrically conductive instrument such as the tweezers. Hence, it is also possible for the semiconductor device 1A to secure superior handleability as well as higher operational reliability.

2.2 Second Modification Example

Figure 4:
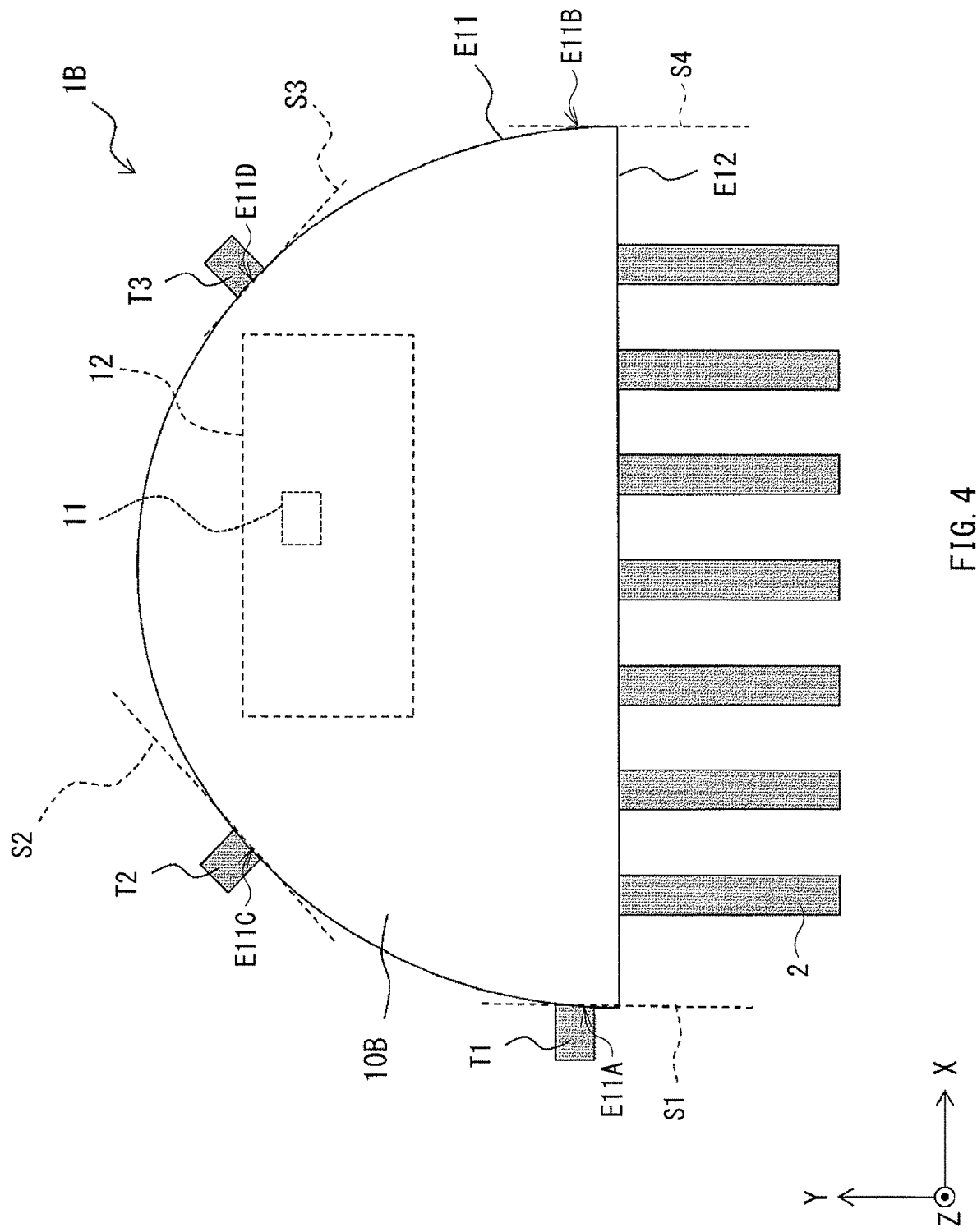
FIG. 4 is a plan view of an outline configuration example of an appearance of a semiconductor device according to a second modification example.

FIG. 4 is a plan view of an outline configuration example of an appearance of a semiconductor device 1B according to a second modification example of the disclosure. The semiconductor device 1B has substantially the same configuration as that of the semiconductor device 1 of the foregoing example embodiment, except that the semiconductor device 1B includes a mold resin 10B instead of the mold resin 10. The mold resin 10B may have a semicircular planar shape. The outer edge of the mold resin 10B may include a curved outer edge part E11 and an outer edge part E12 that extends in a substantially straight manner. In this example, the tie bar T1 may protrude to the outside of the mold resin 10B from a part E11A of the outer edge part E11; the tie bar T2 may protrude to the outside of the mold resin 10B from a part E11C of the outer edge part E11; and the tie bar T3 may protrude to the outside of the mold resin 10B from a part E11D of the outer edge part E11. The outer edge part E11 may have a tangent S1 at the part E11A. The outer edge part E11 may have a tangent S2 at the part E11C. The outer edge part E11 may have a tangent S3 at the part E11D. The tangents S1, S2, and S3, however, may not be parallel to one another, and may extend in directions that intersect one another. In an example embodiment, an angle at which the tangents S1 to S3 intersect one another may be 45° or more. The outer edge part E11 may further include a part E11B on side opposite to the part E11A. The tangent S1 at the part E11A and the tangent S4 at the part E11B are substantially parallel to each other.

As described, in the semiconductor device 1B according to the present modification example, the tie bars T1 to T3 may each protrude to the outside of the mold resin 10B from the curved outer edge part E11. In this example, the tangent S1 at the position, of the outer edge part E11, where the tie bar T2 is provided, the tangent S2 at the position, of the outer edge part E11, where the tie bar T1 is provided, and the tangent S3 at the position, of the outer edge part E11, where the tie bar T3 is provided may extend in directions that are different from one another. Accordingly, there is an extremely low possibility that the electrically conductive instrument such as the tweezers comes into contact with two or more of the tie bars T1 to T3 simultaneously when holding the mold resin 10B of the semiconductor device 1B using the electrically conductive instrument. Suppose that the tangents S1 to S3 are parallel to one another, however, for example, the tie bar T1 and the tie bar T2 may be adjacent to each other, or the tie bar T1 and the tie bar T3 may be positioned diametrically opposite to each other across the mold resin 10B. In this case, the electrically conductive instrument that holds the mold resin 10B is more likely to come into contact with both of the tie bar T1 and the tie bar T2 simultaneously. Otherwise the electrically conductive instrument is more likely to come into contact with both of the tie bar T1 and the tie bar T3 simultaneously. In contrast, in the semiconductor device 1B according to the present modification example, the tangents S1 to S3 may be nonparallel to one another. Thus, it is possible to avoid an unexpected circumstance, for example, where the semiconductor element 11 may be damaged due to a short circuit via two or more of the tie bars T1 to T3 via the electrically conductive instrument such as the tweezers. Hence, it is also possible for the semiconductor device 1B to secure superior handleability as well as higher operational reliability.

2.3 Third Modification Example

Figure 5:
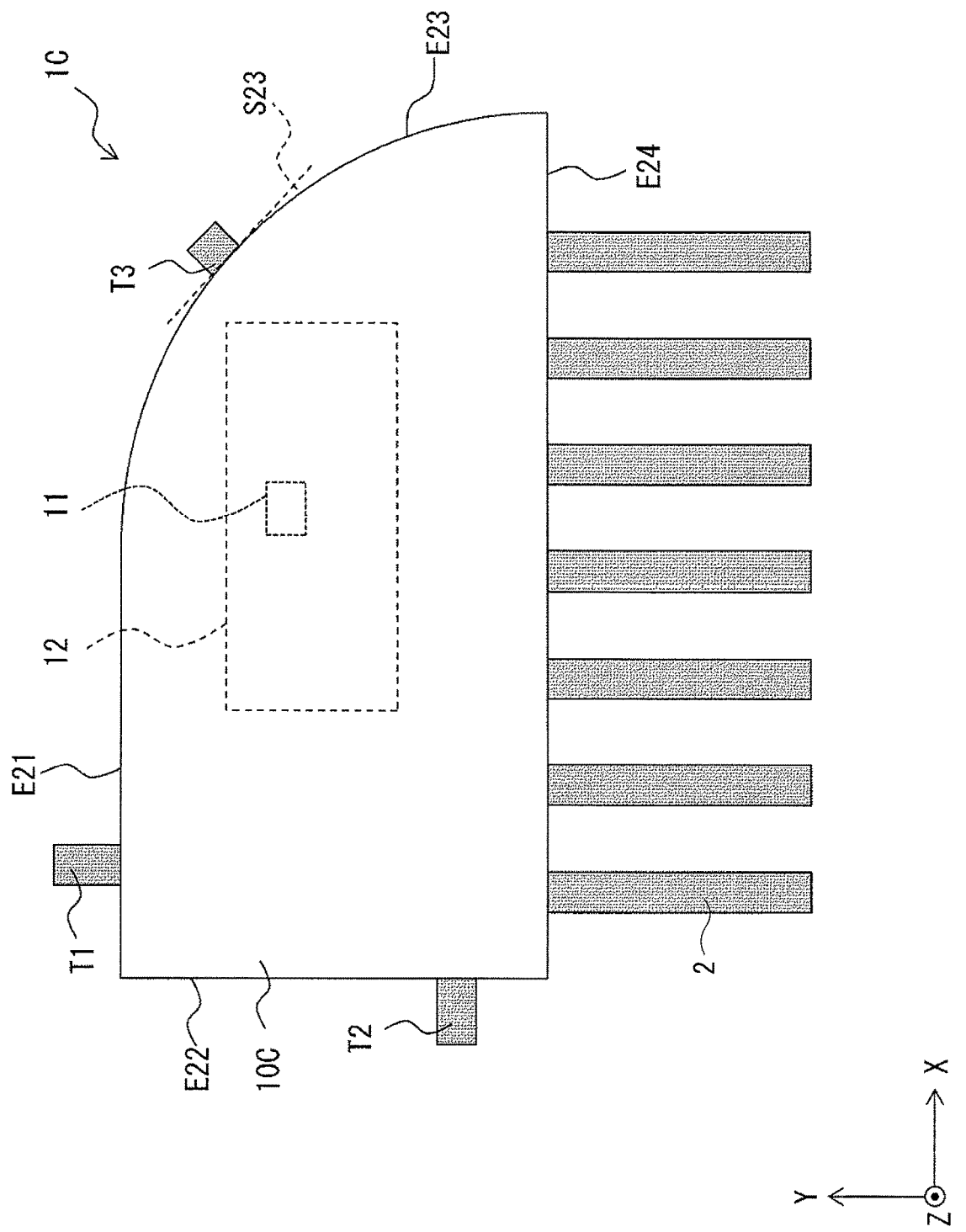
FIG. 5 is a plan view of an outline configuration example of an appearance of a semiconductor device according to a third modification example.

FIG. 5 is a plan view of an outline configuration example of an appearance of a semiconductor device 1C according to a third modification example of the disclosure. The semiconductor device 1C has substantially the same configuration as that of the semiconductor device 1 of the foregoing example embodiment, except that the semiconductor device 1C includes a mold resin 10C instead of the mold resin 10. The mold resin 10C may include a curved outer edge part E23, and outer edge parts E21, E22, and E24 that extend in a substantially straight manner. The outer edge part E21 and the outer edge part E24 are parallel to each other, and may each extend in the X-axis direction. The outer edge part E22 intersects (in FIG. 5, may be orthogonal to) both of the outer edge part E21 and the outer edge part E24, and may extend in the Y-axis direction, for example. The outer edge part E23 may connect the outer edge part E21 and the outer edge part E24 together, and may extend in an arc manner. In this example, the tie bars T1 to T3 may protrude to the outside of the mold resin 10C from the outer edge parts E21 to E23, respectively. The outer edge part E23 may have a tangent S23 at a position where the tie bar T3 is provided. The tangent S23, however, may not be parallel to any of the outer edge part E21 and the outer edge part E22, and may extend in a direction that intersects any of the outer edge part E21 and the outer edge part E22. In an example embodiment, the tangent S23 may have a larger angle, i.e., an angle close to 45° relative to each of the outer edge part E21 and the outer edge part E22.

As described, in the semiconductor device 1C according to the present modification example, the tie bars T1 to T3 may protrude to the outside of the mold resin 10C from the outer edge parts E21 to E23, respectively. In this example, the outer edge part E21 and the outer edge part E22 extend in directions that intersect each other. In addition, the tangent S23 at the position, of the outer edge part E23, where the tie bar T3 is provided may extend in a direction that intersects both of the outer edge part E21 and the outer edge part E22. Accordingly, there is an extremely low possibility that the electrically conductive instrument such as the tweezers comes into contact with two or more of the tie bars T1 to T3 simultaneously when holding the mold resin 10C of the semiconductor device 1C using the electrically conductive instrument. Thus, it is possible to avoid an unexpected circumstance, for example, where the semiconductor element 11 may be damaged due to a short circuit among two or more of the tie bars T1 to T3 via the electrically conductive instrument such as the tweezers. Hence, it is also possible for the semiconductor device 1C to secure superior handleability as well as higher operational reliability.

In the semiconductor device of an example embodiment of the disclosure, the shape, the arrangement, and the number of the lead are not limited to those illustrated in figures such as FIG. 1A; any other shape, any other arrangement, and any other number may be selected.

It is to be noted that the effects described herein are merely exemplary and not limitative, and may include other effects.

Moreover, the disclosure encompasses any possible combination of some or all of the various embodiments and the modification examples described herein and incorporated herein.

It is possible to achieve at least the following configurations from the above-described example embodiments of the disclosure.

(1)

A semiconductor device including:

a base having an outer edge including a first part, a second part, and a third part, the first part and the second part being substantially parallel to each other, the third part extending in a direction that intersects both of the first part and the second part;

a semiconductor element covered with the base;

a first conductor coupled to the semiconductor element, and protruding to an outside of the base from the first part of the outer edge; and a second conductor coupled to the semiconductor element, and protruding to the outside of the base from the third part of the outer edge.

(2)

The semiconductor device according to (1), further including a third conductor coupled to the semiconductor element, in which the outer edge further includes a fourth part extending in a direction that intersects all of the first part, the second part, and the third part, and the third conductor protrudes to the outside of the base from the fourth part of the outer edge.

(3)

The semiconductor device according to (2), further including a first electronic component provided between the first conductor and the second conductor.

(4)

The semiconductor device according to (2) or (3), further including one or a plurality of leads each coupled to the semiconductor element, and each protruding to the outside of the base from the second part.

(5)

The semiconductor device according to (4), further including a second electronic component provided between the third conductor and any one of the plurality of leads.

(6)

The semiconductor device according to (4) or (5), in which a protrusion length of the first conductor from the first part, a protrusion length of the second conductor from the third part, and a protrusion length of the third conductor from the fourth part are each smaller than a protrusion length of each of the one or the plurality of leads from the second part.

(7)

The semiconductor device according to any one of (4) to (6), in which the plurality of leads are disposed along the second part of the outer edge.

(8)

The semiconductor device according to (1), further including one or a plurality of leads each coupled to the semiconductor element, and each protruding to the outside of the base from the second part.

(9)

The semiconductor device according to (8), in which a protrusion length of the first conductor from the first part and a protrusion length of the second conductor from the third part are each smaller than a protrusion length of each of the one or the plurality of leads from the second part.

(10)

The semiconductor device according to (8) or (9), in which the plurality of leads are disposed along the second part of the outer edge.

In the semiconductor device according to one example embodiment of the disclosure, the first conductor protrudes to the outside of the base from the first part of the outer edge. The second conductor protrudes to the outside of the base from the third part of the outer edge. The third part extends in a direction that intersects the first part. Accordingly, there is an extremely low possibility that the electrically conductive instrument such as the tweezers comes into contact with both of the first conductor and the second conductor simultaneously when holding the base of the semiconductor device using the electrically conductive instrument.

According to the semiconductor device of one example embodiment of the disclosure, it is possible to secure superior handleability as well as higher operational reliability.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A semiconductor device comprising:
a base having an outer edge including a first part, a second part, a third part, and a fourth part, the first part and the third part being substantially non-parallel to each other, the fourth part being substantially non-parallel to the first part, the second part, and the third part;
a semiconductor element provided on the base; and
a plurality of conductors each coupled to the semiconductor element;
wherein:
the plurality of conductors includes a first conductor, a second conductor, and a third conductor,
the first conductor is coupled to the semiconductor element, protrudes to an outside of the base from the first part of the outer edge, and is the only conductor that extends from the first part; and
the second conductor is coupled to the semiconductor element, protrudes to the outside of the base from the third part of the outer edge, and is the only conductor that extends from the third part; and
the third conductor protrudes to the outside from the fourth part.

2. The semiconductor device according to claim 1, further comprising one or more leads coupled to the semiconductor element,
wherein the second part extends so as to intersect the third part,
wherein the first part and the second part are substantially parallel to each other, and
wherein the one or more leads protrude to the outside of the base from only the second part.

3. The semiconductor device according to claim 2,
wherein the one or more leads comprises a plurality of leads, and the plurality of leads are disposed along the second part.

4. The semiconductor device according to claim 1, further comprising a first electronic component provided between the first conductor and the second conductor.

5. The semiconductor device according to claim 1, further comprising a second electronic component provided between the third conductor and the one or more leads.

6. The semiconductor device according to claim 1, further comprising one or a plurality of leads each coupled to the semiconductor element, and each protruding to the outside of the base from the second part of the outer edge.

7. The semiconductor device according to claim 6, wherein the plurality of leads are disposed along the second part of the outer edge.

* * * * *